United States Patent
Jeon et al.

(10) Patent No.: US 9,361,062 B2
(45) Date of Patent: Jun. 7, 2016

(54) METHOD FOR PROVIDING A VOICE-SPEECH SERVICE AND MOBILE TERMINAL IMPLEMENTING THE SAME

(71) Applicant: Samsung Electronics Co., Ltd., Suwon-si, Gyeonggi-do (KR)

(72) Inventors: Hayoung Jeon, Incheon (KR); Sora Kim, Goyang-si (KR); Heewoon Kim, Suwon-si (KR); Yumi Ahn, Hanam-si (KR); Jihyun Ahn, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 145 days.

(21) Appl. No.: 14/183,945

(22) Filed: Feb. 19, 2014

(65) Prior Publication Data

US 2014/0245155 A1    Aug. 28, 2014

(30) Foreign Application Priority Data

Feb. 22, 2013    (KR) .................. 10-2013-0019494

(51) Int. Cl.
*G06F 3/16* (2006.01)
*G10L 15/22* (2006.01)
*G06F 3/048* (2013.01)
*H04M 1/60* (2006.01)
*H04M 1/725* (2006.01)

(52) U.S. Cl.
CPC ............... *G06F 3/167* (2013.01); *G06F 3/048* (2013.01); *G10L 15/22* (2013.01); *H04M 1/6075* (2013.01); *H04M 1/7253* (2013.01); *H04M 1/72569* (2013.01); *H04M 1/72577* (2013.01)

(58) Field of Classification Search
CPC ....... G06F 3/0481; G06F 3/16; G10L 15/265; G10L 13/08; G01C 21/26
USPC .............. 715/728, 865; 704/246, 260; 701/36
See application file for complete search history.

(56) References Cited

U.S. PATENT DOCUMENTS

| | | |
|---|---|---|
| 2007/0291664 A1 | 12/2007 | Weyl et al. |
| 2010/0049515 A1 | 2/2010 | Sumiyoshi et al. |
| 2011/0173002 A1 | 7/2011 | Fujii et al. |
| 2011/0195758 A1 | 8/2011 | Damale et al. |
| 2011/0257973 A1 | 10/2011 | Chutorash et al. |
| 2012/0001843 A1* | 1/2012 | Gravino ............... G06F 1/1694 345/156 |
| 2013/0262115 A1* | 10/2013 | Chuang .................. G10L 15/00 704/246 |

FOREIGN PATENT DOCUMENTS

| | | |
|---|---|---|
| KR | 10-2004-0035515 A | 4/2004 |
| KR | 10-2005-0077989 A | 8/2005 |
| KR | 10-2012-0091495 A | 8/2012 |
| WO | 2009-073806 A2 | 6/2009 |

OTHER PUBLICATIONS

Samsung Galaxy SII Mobile Phone User Manual, "GalaxysII.pdf" 2011, 203 pages.*

* cited by examiner

*Primary Examiner* — Haoshian Shih
(74) *Attorney, Agent, or Firm* — Jefferson IP Law, LLP (57) ABSTRACT

A method of providing a voice-speech service in a mobile terminal is provided. The method includes receiving sensing information from a sensor unit, determining whether to set an operating mode of the voice-speech service as a driving mode according to the sensing information, and providing an audible feedback according to pre-stored driving mode setting information when an operating mode of the voice-speech service is set as the driving mode.

15 Claims, 10 Drawing Sheets

<DRIVING MODE>

FIG. 5B

<NON-DRIVING MODE>

<DRIVING MODE>

FIG. 7B

<NON-DRIVING MODE>

METHOD FOR PROVIDING A VOICE-SPEECH SERVICE AND MOBILE TERMINAL IMPLEMENTING THE SAME

CROSS-REFERENCE TO RELATED APPLICATION(S)

This application claims the benefit under 35 U.S.C. §119(a) of a Korean patent application filed on Feb. 22, 2013 in the Korean Intellectual Property Office and assigned Serial No. 10-2013-0019494, the entire disclosure of which is hereby incorporated by reference.

TECHNICAL FIELD

The present disclosure relates to a method for providing a voice-speech service, in which a user's voice is recognized in a mobile terminal and a feedback corresponding to the user's voice is provided to the user using a voice, and a mobile terminal which implements the method.

BACKGROUND

A related art voice-speech service is composed of a speech, speaking or voice interaction, such as a voice or speech conversation, between a user and a voice agent of a mobile terminal, which may be a smartphone, or any suitable portable electronic device, and a Graphic User Interface (GUI) for showing contents related with the speech including a history of the speech. The related art voice-speech service is basically a service which is designed based on a situation of viewing a screen. That is, the user frequently interacts, i.e., converses, with a voice agent while viewing the screen for selection, correction and editing of contents.

If the user's voice is inputted to a microphone, the voice is converted into a text, for example, by doing a Speech To Text (STT) conversion, and is then outputted on the screen. The meaning of the text is processed, and the result is provided as a GUI feedback and as a Text To Speech (TTS) feedback. That is, the GUI feedback is visual information which is displayed on the screen, and the TTS feedback is audible information which is outputted through a speaker after the text is converted into a voice. When there are many results, generally only summary information is provided as a TTS feedback, and detailed information is provided as a GUI feedback. Likewise, the detailed information is visibly provided, or in other words, is outputted as visual information for viewing rather than audible information for listening.

However, according to the related art voice-speech service, when the user's situation is visibly restricted, such that the user is restricted from viewing the mobile terminal, it is difficult for the user to use the voice-speech service. In particular, when the user is driving, the GUI feedback may disturb driving and threaten the user's safety.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure may provide a method of providing a voice-speech service which is optimized for a user's situation, and a mobile terminal which implements the method. In particular, the present disclosure may provide a method of providing a voice-speech service which is optimized for a driving or operating of a vehicle situation, and a mobile terminal which implements the method.

In accordance with an aspect of the present disclosure, a method of a voice-speech service in a mobile terminal is provided. The method includes receiving sensing information from a sensor unit, determining whether to set an operating mode of the voice-speech service as a driving mode according to the sensing information, and providing an audible feedback according to pre-stored driving mode setting information when an operating mode of the voice-speech service is set as the driving mode.

In accordance with another aspect of the present disclosure, a method of a voice-speech service in a mobile terminal is provided. The method includes receiving a message, converting the message into an audible feedback, and providing the audible feedback according to pre-stored driving mode setting information when an operation mode of the voice-speech service is a driving mode.

In accordance with another aspect of the present disclosure, a method of a voice-speech service in a mobile terminal is provided. The method includes detecting voice data from a microphone, performing a function corresponding to the voice data, converting a result of the performing of the function into an audible feedback, and providing the audible feedback according to pre-stored driving mode setting information if an operation mode of the voice-speech service is a driving mode.

In accordance with another aspect of the present disclosure, a mobile terminal for providing a voice-speech service is provided. The mobile terminal includes a microphone, a speaker, an audio processing unit configured to process a signal received from at least one of the microphone and the speaker, a storage unit configured to store driving mode setting information, a sensor unit configured to sense a physical amount, and a controller configured to control at least one of the microphone, the speaker, the storage unit, the audio processing unit, and the sensor unit, wherein the controller is configured to receive sensing information, to determine whether to set an operating mode of the voice-speech service as a driving mode according to the sensing information, and to provide an audible feedback according to the driving mode setting information if the operation mode of the voice-speech service is set as the driving mode.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, a method of providing a voice-speech service and a mobile terminal which implements the method will be described.

The mobile terminal, according to the present disclosure, may be a portable terminal, portable electronic device, or a terminal or electronic device which is installed in an automobile and is movable. For example, the mobile terminal may be a smartphone, a tablet Personal Computer (PC), a PC, a notebook computer, a digital camera, a Personal Digital Assistant (PDA), a Portable Multimedia Player (PMP), a media player, such as a Motion Picture Experts Group (MPEG) Audio Layer 3 (MP3) player, a navigation terminal, or any other similar and/or suitable electronic device.

The mobile terminal, according to the present disclosure, provides an audible feedback, e.g., a voice which is outputted from a speaker, a visible feedback, e.g., an image displayed on the screen of the display unit, and a tactile feedback, e.g., vibration of a vibrating motor included in a mobile terminal, and any other similar and/or suitable feedback. The audible feedback may be referred to as a Text To Speech (TTS) feedback, audible information, audible contents, audible feedback, and the word "audible" may be interchangeably used with "audio" and "auditory". The visible feedback may be referred to as a Graphic User Interface (GUI) feedback, visible information, visible contents, visible feedback, and the word "visible" may be interchangeably used with "video". In particular, when a user is driving, a mode corresponding to an environment in which the mobile terminal of the present disclosure is used is set to be a driving mode. For example, in the driving mode, the voice setting value of the speaker is set to the maximum value, the setting value of the replay speed of the voice is automatically set to the maximum value according to the amount of information, and the setting value of the font size of the GUI feedback is set to the maximum value. Also, TTS feedback and GUI feedback are provided with reference to the setting information of the driving mode. As such, the user may be provided the voice-speech service while not disturbing the driving performed by the user.

Figure 1:
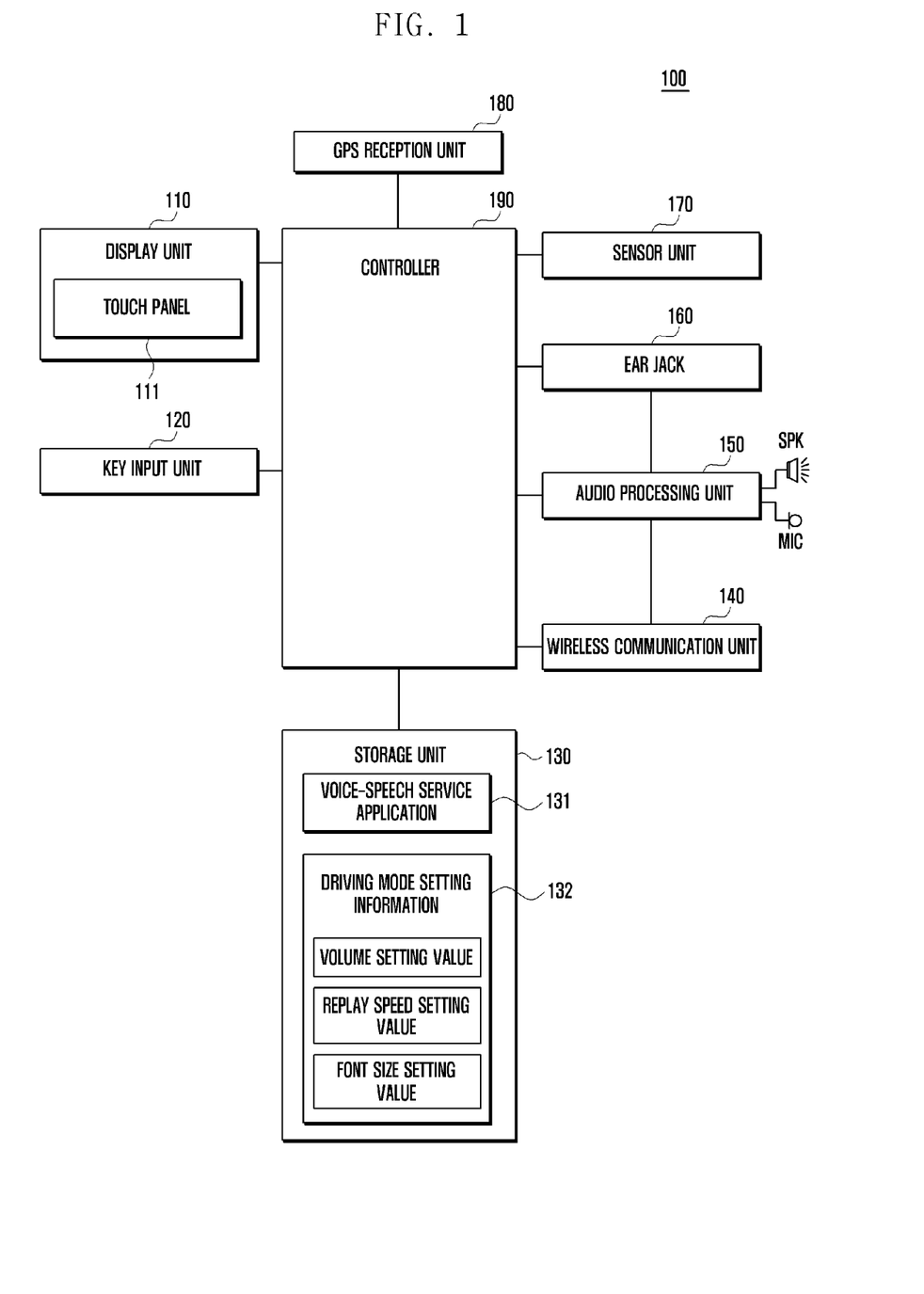
FIG. 1 is a block diagram of a mobile terminal according to an embodiment of the present disclosure.

FIG. 1 is a block diagram of a mobile terminal according to an embodiment of the present disclosure.

Referring to FIG. 1, the mobile terminal according to an embodiment of the present disclosure includes a display unit 110, a key input unit 120, a storage unit 130, a wireless communication unit 140, an audio processing unit 150, a speaker SPK, a microphone MIC, an ear jack 160, a sensor unit 170, a GPS reception unit 180, and a controller 190.

The display unit 110 displays data on a screen under control of the controller 190. That is, if the controller 190 processes, e.g., decodes, data and stores the processed data in a buffer, the display unit 110 converts data stored in the buffer into analog signals and displays the analog signals on the screen. If power is supplied to the display unit 110, then the display unit 110 may display a locking image on the screen according to a state of the mobile terminal 100. If unlocking information is detected in the state where the locking image is being displayed, the controller 190 releases the locking and stops displaying the locking image. The display unit 110 also displays, for example, a home image, instead of a locking image, under control of the controller 190. The home image may include a background image, e.g., photos which are set by a user, a plurality of icons which are displayed on the background image, or any other similar and/or suitable images that may be displayed on the display unit 110. Here, icons respectively indicate, applications, contents, or any other similar and/or suitable element, such as a photo file, a video file, a recording file, a document, and a message. If one of the icons, for example, an application icon, is selected by the user, then the controller 190 executes the corresponding application. The display unit 110 receives an execution image of the application from the controller 190, converts the image into analog signals, and outputs the analog signals so as to be displayed on the display unit 110.

The display unit 110 may display images in a multi-layer structure on a screen under control of the controller 190. For example, the display unit 110 displays an execution image of a voice-speech service, and displays the GUI feedback thereon.

The display unit 110 may be formed of a Liquid Crystal Display (LCD), an Organic Light Emitted Diode (OLED) display, an Active Matrix OLED (AMOLED) display, a flexible display, a transparent display, or any other similar and/or suitable type of display.

The touch panel 111 is installed on the display unit 110. Specifically, the touch panel 111 is implemented as an add-on type element or unit located on the display unit 110, and may be an on-cell type or an in-cell type which is inserted into the display unit 110.

The touch panel 111 generates a touch event in response to the user's gesture on the screen, converts the touch event into digital data by performing an Analog to Digital (AD) conversion, and transmits the digital data to the controller 190. Here, the touch event includes one or more touch coordinates (x, y). For example, a touch Integrated Circuit (IC) of the touch panel 111 detects the user's touch, determines touch coordinates (x, y) of the touched area in response to the touch, and transmits the touch coordinates (x, y) of the touched area to the controller 190. Here, the touch coordinates (x, y) may be in pixel units. For example, when the resolution of the screen is 640 by 480, wherein 640 is the number of horizontal pixels, and 480 is the number of vertical pixels, the x-axis coordinates are in the range of (0, 640), and the y-axis coordinates are in the range of (0, 480).

When touch coordinates are received from the touch panel 111, the controller 190 determines that a touch input tool, e.g., a finger or a pen, has touched the touch panel 111, and when the touch coordinates are not received from the touch panel 111, the controller 190 determines that a touch of the touch input tool has been released. Further, when the touched coordinates are changed from (x0, y0) to (x1, y1) and a variation, e.g., D (D2=(x0−x1)2+(y0−y1)2, exceeds a preset movement threshold, e.g., 1 mm, the controller 190 determines that there has been a movement of the touch input tool. The controller 190 calculates the location variation (dx, dy), or in other words, the amount of movement, of the touch input tool and movement speed of the touch input tool in response to the movement of the touch input tool. The controller 190 determines the user's gesture on the screen to be one of a touch, a multi-touch, a tap, a double tap, a long tap, a tap & touch, a drag, a flick, a press, a pinch-in, a pinch-out, and any other similar and/or suitable touch gesture, based on the touch coordinates, whether the touch of the touch input tool has been released, whether the touch input tool has been moved, the location variation, or amount of movement, of the touch input tool, and the movement speed of the touch input tool.

The touch is a gesture by which the user makes the touch input tool contact the screen, the multi-touch is a gesture by which a plurality of touch input tools, e.g., the thumb and forefinger or more than one stylus, touch the screen, the tap is a gesture by which the touch input tool touches one point of the screen and is then released from the point, the double tap is a gesture of tapping one point consecutively twice, the long tap is a gesture of touching one point relatively for a long time and then releasing the touching of the point, the tap and touch is a gesture of tapping one point of the screen and then re-touching the point within a predetermined time, e.g., 0.5 seconds, the drag is a gesture of moving the touch input tool in a predetermined direction in a state where one point is being touched, the flick is a gesture of quickly moving the touch input tool compared to the drag and releasing the touch, the press is a gesture of touching one point and maintaining the touch without movement for more than a predetermined time, e.g., 2 seconds, the pinch-in is a gesture of simultaneously multi-touching two points using two touch input tools and then narrowing the gap between the touch tools, and the pinch-out is a gesture of widening a gap, or distance, between the touch input tools. That is, the touch is a contacting of at least one touch input tool the touch panel 111, and other gestures are a change of the touch.

The touch panel 111 may include a hand touch panel that senses a hand gesture and a pen touch panel that senses a pen gesture. Here, the hand touch panel is implemented as a capacitive type. The hand touch panel may be implemented as a resistive type, an infrared ray type, or an ultrasonic wave type. Further, the hand touch panel does not generate a touch event only by the hand gesture, and may generate a touch event by another object, e.g., an object of conductive materials which may change capacitance. The pen touch panel may be formed as an electromagnetic induction type. As such, the pen touch panel generates a touch event by a touch from a pen which forms or produces a magnetic field. In particular, the touch event generated in the pen touch panel includes a value indicating the type of a touch along with the touch coordinates. For example, when a first voltage level value is received from the pen touch panel, the controller 190 determines whether the touch of the touch input tool in an indirect touch, such as a hovering touch gesture. When a second voltage level value, which is greater than the first voltage level, is received from the touch panel 111, the controller 190 determines that the touch of the touch input tool is a direct touch. Further, the touch event generated by the pen touch panel may further include a value indicating whether a key installed in the pen has been pressed. For example, if the key installed in the pen is pressed, then the magnetic field generated in the coil of the pen is changed, and the pen touch panel generates a third voltage level value in response to the change of the magnetic field and transmits the third voltage level value to the controller 190.

The key input unit 120 may include at least one touch key. The touch key is implemented as a capacitive type or a resistive type to sense the user's touch. The touch key generates an event in response to the user's touch and transmits the event to the controller 190. Further, the touch key may be installed adjacently to the screen, e.g., the lower part of the screen. Further, the key input unit 120 may include a key of another type in addition to the touch key. For example, a dome key type, a home key, or any other similar and/or suitable type of key may be included. If the user presses a home key, the home key is transformed to contact a printed circuit board, and as such, a key event is generated in the printed circuit board and the key event is transmitted to the controller 190. Further, if the user presses the home key twice, then a voice-speech service application 131 may be executed according to the present disclosure.

The storage unit 130 may be a disk, a Random Access Memory (RAM), a Read Only Memory (ROM), a flash memory, or any other similar and/or suitable hardware element that is a non-volatile computer readable storage medium. The storage unit 130 stores data which is generated in the mobile terminal 100 or is received from an external device, such as a server, a desktop Personal Computer (PC), a tablet PC, or any other similar and/or suitable external device, through the wireless communication unit 140 under control of the controller 190. Further, the storage unit 130 temporarily stores data, which is copied and or generated by the user from a message, a photo, a web page, a document, or other similar and/or suitable data sources, for a copy & paste, or other similar and/or suitable actions.

Further, the storage unit 130 stores driving mode setting information 132. Here, the driving mode setting information 132 may include a volume setting value, a replay speed setting value, a font size setting value, or any other similar and/or suitable setting values. The volume setting value indicates a volume of sounds which are outputted from the speaker SPK. For example, the volume setting value may be set to a value indicating a maximum volume when the operating mode of the voice-speech service is set as the driving mode. The replay speed setting value indicates a speed of the sound which is outputted from the speaker SPK. For example, the replay speed setting value may be set to a single rate in a case of the non-driving mode and may be set to a double rate in the case of the driving mode. The font size setting value is a value that indicates the size of the text in the GUI feedback. For example, in the non-driving mode, the font size setting value may be set to font size 12, and in the driving mode, the font size setting value may be set to font size 20. Further, the driving mode setting information 132 may further include the color setting value of the screen and the brightness setting value of the screen. For example, the brightness setting value of the screen may be set to the value indicating a maximum brightness when the operating mode of the voice-speech service is set as the driving mode. Further, when the operating mode of the voice-speech service is set as the driving mode, the color setting value of the screen may be set to be changed to white.

Further, the storage unit 130 stores various setting values, e.g., the screen brightness, whether to be vibrated when a touch occurs, whether the screen is to be automatically rotated, and other similar and/or suitable setting values, for operation of the mobile terminal 100 in addition to the driving mode setting information 132.

The storage unit 130 stores a booting program for booting the mobile terminal 100, one or more operating systems and applications. The operating system serves as an interface between hardware and the application and between applications, and manages computer resources such as a Central Processing Unit (CPU), a Graphics Processing Unit (GPU), a main memory, and the storage unit 130. The applications may be at least one of embedded applications and third party applications. Some examples of the embedded applications are a web browser, an e-mail program, and an instant messenger. In particular, the storage unit 130 stores the voice-speech service application 131. The voice-speech service application 131 may include a routine of determining whether the user is driving or operating a vehicle, a Speech To Text (STT) routine of converting voice data, such as the user's request for information, into a text, a routine of inferring the meaning of the text, a routine of performing a function corresponding to the meaning of the inferred text, a routine of providing response information according to execution of a function as a TTS feedback, and a routine of providing the response information as a GUI feedback.

In particular, the TTS feedback and the GUI feedback are differently provided according to whether the user is driving or operating a vehicle. That is, if the user is driving or operating the vehicle, the amount of the GUI feedback is minimized, and the amount of the TTS feedback is maximized. For example, if the user is not driving, then the detailed information is provided as the GUI feedback, and simply summarized information, corresponding to the detailed information, is provided as the TTS feedback. In contrast, when driving or operating the vehicle, the summarized information is provided as the GUI feedback, and the detailed information is provided as the TTS feedback. Further, when the user is driving or operating the vehicle, the readability of the GUI feedback is enhanced so that the user may intuitively recognize the meaning for a short time. For example, when the user is not driving or operating the vehicle, the text size may be set to font size 12, and when the user is driving or operating the vehicle, the text size may be set to font size 20. If the user is not driving, a thickness of the text may be 1, and when the user is driving, the thickness of the text may be 3. However, the present disclosure is not limited thereto, and any suitable and/or similar font size and thickness of the text may be used.

Further, a particular routine, from among routines of the voice-speech service application 131, may be included in a server that is separate from the mobile terminal 100. For example, the routine of inferring the meaning of the text may be included in the server. In this case, the mobile terminal 100 transmits the text to the server. The server infers the meaning of the text in response thereto, and transmits the result to the mobile terminal 100.

The wireless communication unit 140 performs a voice call, a video call, a data communication, and any other similar and/or suitable communication services, with an external device through a network under control of the controller 190. The wireless communication unit 140 includes a transmission unit (not shown) that up-converts and amplifies a frequency of a transmitted signal, and a wireless frequency reception unit (not shown) that low-noise-amplifies and down-converts the frequency of a received signal. Further, the wireless communication unit 130 may include a mobile communication module (not shown), e.g., a 3rd-generation mobile communication module, a 3.5th-generation mobile communication module, a 4th-generation mobile communication module, or any other similar and/or suitable communication module, a digital broadcast module, e.g., a Digital Media Broadcast (DMB) module, and a short range communication module, e.g., a Wi-Fi module, a Bluetooth module, and a Near Field Communication (NFC) module.

The audio processing unit 150 is combined with the speaker SPK and the microphone MIC, and inputs and outputs audio signals, e.g., voice data, for voice recognition, voice recording, digital recording, calling, and any other similar and/or suitable operations, applications, and functions that may use audio signals. The audio processing unit 150 may receive audio signals from the controller 190, may Digital to Analog (D/A) convert the received audio signals into analog signals, may amplify the analog signals, and may output the amplified signals through the speaker SPK. The speaker SPK converts audio signals received from the audio processing unit 150 into sound waves, and outputs the sound waves. Further, the mobile terminal may include a plurality of speakers. For example, in such a case, the first speaker is used when making a call, and is called a receiver. That is, the first speaker is used when the user places the mobile terminal 100 near his ear and makes a call. The second speaker is used to replay data such as music and video as well as a call, and is called a loud speaker.

Further, the audio processing unit 150 may output audio signals to the ear jack 160 under control of the controller 190. That is, when a plug of an earphone is connected to the ear jack 160, the audio signal may be output to the earphone through the ear jack 160. Further, the audio processing unit 150 may output audio signals to a Bluetooth module (not shown) of the wireless communication unit 140 under control of the controller 190. That is, when the mobile terminal 100 is connected to the wireless earphone through the Bluetooth module, the audio signals may be outputted to the wireless earphone through the Bluetooth module.

The microphone MIC converts sound waves transmitted from a person or other sound sources into audio signals. The audio processing unit 150 converts the audio signals received from the microphone MIC into digital signals by performing an A/D conversion, and transmits the digital signals to the controller 190.

If the earphone, which may be a headphone, a headset, or any other similar and/or suitable audio listening device, is connected, the ear jack 160 transmits a signal indicating the connection to the controller 190. Further, if the earphone is separated, then the ear jack transmits a signal indicating the separation to the controller 190. As such, the controller 190 may control the audio processing unit 150 to recognize the connection state of the earphone and may set the output unit of the audio signal as the ear jack 160 when the earphone is connected to the ear jack 160.

The ear jack 160 transmits audio signals, which are received from the audio processing unit 150, to the connected earphone, and transmits the audio signals, which are received from the microphone included in the earphone, to the audio processing unit 150. Further, the ear jack 160 receives a key event from the key included in the earphone, and transmits the key event to the controller 190. For example, if the user presses the earphone key twice, then the voice-speech service application 131 may be executed according to the present disclosure.

The sensor unit 170 senses a physical quantity, such as an amount of light, a speed, an acceleration, an altitude, an amount of gravity, or any other similar and/or suitable physical quantity that may be electronically sensed, and senses a change of the physical quantity, generates sensing information, and transmits the sensing information to the controller 190. For example, the sensor unit 170 may include an acceleration sensor, a gyro sensor, a luminance sensor, an orientation sensor, a proximity sensor, a pressure sensor, an image sensor, or any other similar and/or suitable sensor.

The GPS reception unit 190 receives at least one GPS signal, including a transmission time, transmitted by GPS satellites, such as three or more GPS satellites, calculates the distance between the GPS reception unit 190, which is included in the mobile terminal 100, and respective satellites using a time difference between the transmission time and a reception time that indicates when the GPS signal has been received, calculates the position of the mobile terminal 100, i.e., calculates a second-dimensional coordinate value, such as a latitude and/or longitude, using the calculated distance information, and transmits the calculated location information to the controller 190. The calculated function may be performed, for example, in an Application Processor (AP) (not shown).

The controller 190 controls overall operations of the mobile terminal 100 and controls a signal flow between internal components of the mobile terminal, processes data, and controls power supply from the battery to the components. The controller may be any suitable hardware element, such as an IC, an Application Specific IC (ASIC), and processor, a microprocessor, an Erasable Programmable Read Only Memory (EPROM), or any other similar and/or suitable hardware element.

The controller 190 includes one or more Central Processing Units (CPUs) (not shown). The CPU is a core control unit of a computer system, which calculates and compares data, and analyzes and executes commands. The CPU includes various registers which temporarily store data or commands. The controller 190 may also include one or more GPUs (not shown). The GPU is a graphic control unit which processes, calculates and compares graphic-related data, and analyzes and executes commands related to graphics. The CPU and the GPU may be integrated as one package composed of a single IC formed of at least one independent core, e.g., a quad-core processor. That is, the CPUs may be integrated into one multi-core processor. Further, a plurality of GPUs may be integrated into one multi-core processor. Further, the CPU and the GPU may be integrated into one chip, e.g., a System on Chip (SoC). Further, the CPU and the GPU may be packaged into a multi-layer unit. Further, the AP may include a CPU and a GPU. Further, the AP may include an ISP.

The controller 190 includes a main memory, for example, a RAM or any other similar and/or suitable hardware element. The main memory stores various programs loaded from the storage unit 130, for example, a booting program, an operating system, and applications. If the power of the battery is supplied to the controller 190, then the booting program may be loaded to the main memory. Such a booting program loads the operating system to the main memory. The operating system loads the applications to the main memory. The controller 190, e.g., an AP, accesses such a program to decode the command of the program, and executes a function, e.g., a voice-speech service, according to the decoding result. Further, the controller 190 includes a cache memory which temporarily stores data to be written in the storage unit 130, and temporarily stores data which is read from the storage unit 130.

If the request for the voice-speech service is detected, then the controller 190 may execute the voice-speech service application 131, and provide a greeting message as an audible feedback and as a visible feedback. Further, when the operating mode of the voice-speech service is set as the driving mode, then the controller 190 may collect additional information such as traffic information and weather information. For example, the controller 190 controls the wireless communication unit 140 to connect to the server that provides the information and then to receive the information from the server. The controller 190 may provide the additional information received from the wireless communication unit 140 along with the basic greetings, e.g., "It's raining now. Please drive safely!".

The controller 190 determines whether the user is driving or operating a vehicle. For example, the controller 190 determines operating mode information that is stored in the storage unit 130. As a result, if the operating mode information is set as the "driving mode", then the controller 190 determines that the user is driving. That is, the user may directly set the operating mode of the voice-speech service as the driving mode.

As another example, if the voice-speech service application 131 is being executed, then the controller 190 controls the sensor unit 170 to generate the sensing information. The controller 190 senses the sensing information from the sensor unit 170, and calculates the speed, moving direction, acceleration, or other similar values, using the sensing information. The controller 190 determines whether the user is driving or operating a vehicle using the calculated value. For example, if the speed is greater than 40 km/h and the moving direction is constant for a predetermined time period, e.g., 3 seconds or any suitable amount of time, then the controller 190 determines that the user is driving.

As another example, the controller 190 determines whether the user is driving or operating the vehicle using map information and two-dimensional coordinates, such as latitude and/or longitude. The controller 190 determines the location of the user, or, in other words, determines the location of the mobile terminal 100, through the map information and the two-dimensional coordinates. If it is determined that the user is riding a subway rather than driving or operating a vehicle, then the controller 190 determines that the user is not driving regardless of the speed of the mobile terminal 100.

As another example, the controller 190 determines whether the user is driving or operating a vehicle using the identification information of an external device which is wirelessly connected. For example, when the identification information of an external device connected to the Bluetooth module indicates "automobile", then the controller 190 determines that the user is riding an automobile. Here, if the speed is greater than or equal to 40 km/h, then the controller 190 determines that the user is driving or operating a vehicle.

If it is determined that the user of the mobile terminal 100 is driving, then the controller 190 sets the operating mode of the voice-speech service as the driving mode. If the operating mode of the voice-speech service is set as the driving mode, then the controller 190 may set the volume of sounds outputted from the speaker SPK as the maximum value. As such, the TTS feedback is outputted as the maximum volume. The user may hear the TTS feedback even in a noisy environment. However, when the output unit of the audio system is not a speaker, but an earphone, e.g., an earphone connected to the ear jack 160 or a wireless earphone connected to the Bluetooth module, then the volume may be maintained without an upward increase, or may be adjusted according to a user input.

If the amount of the TTS feedback exceeds a predetermined threshold in a state where the operating mode of the voice-speech service is set to be the driving mode, then the controller 190 may set the replay speed to the double rate. As such, if the amount of the TTS feedback is 100 characters or more, then the TTS feedback is replayed at the double rate. Accordingly, the user may quickly listen to the TTS feedback in a shorter amount of time. Further, the controller 190 sets the importance of the TTS feedback as "high". As such, the detailed information is provided as the TTS feedback, and the summary information is provided as the GUI feedback. At this time, for example, if the speed is 100 km/h, even the summary information may not be provided as the GUI feedback.

The mobile terminal 100 may further include components which are not mentioned above, such as a vibration motor and an accessory. Here, the accessories are accessories of the mobile terminal, which may be separated from the mobile terminal 100, for example, a pen for a touch, a power adapter, or external or peripheral devices that may be attached or connected to the mobile terminal 100.

Figure 2:
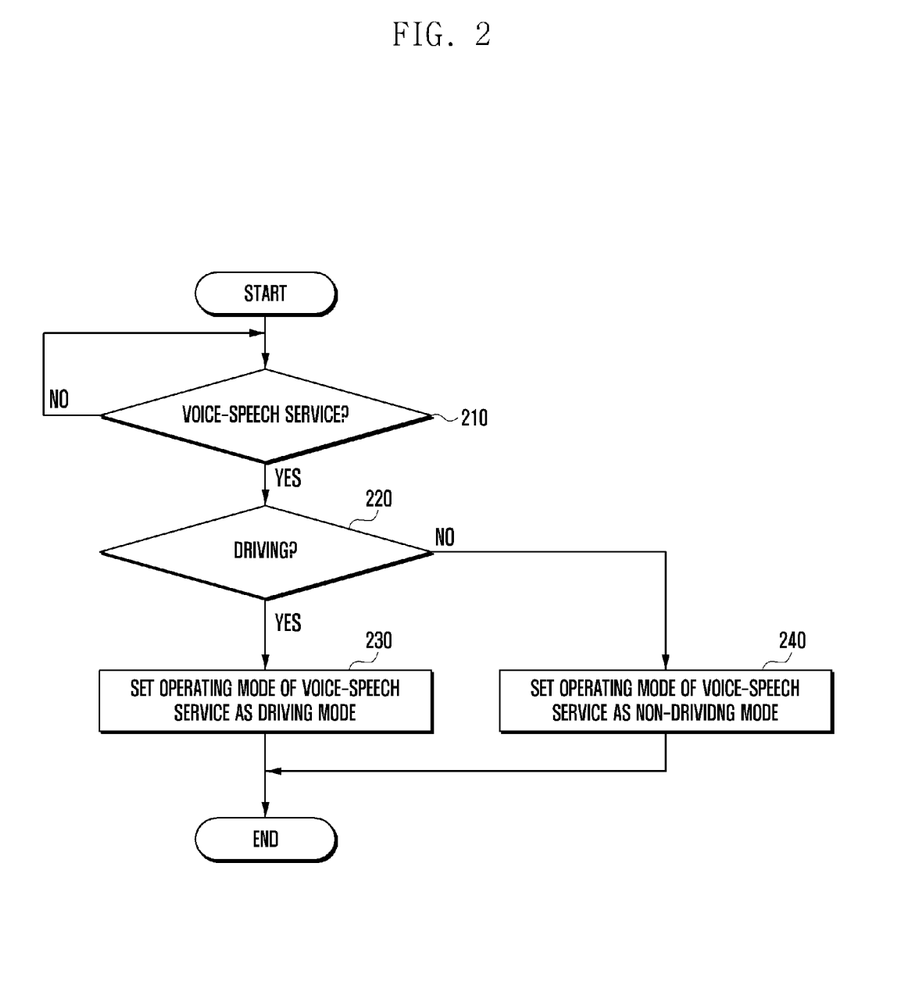
FIG. 2 is a flowchart illustrating a method of setting a driving mode according to an embodiment of the present disclosure.
Figure 3A:
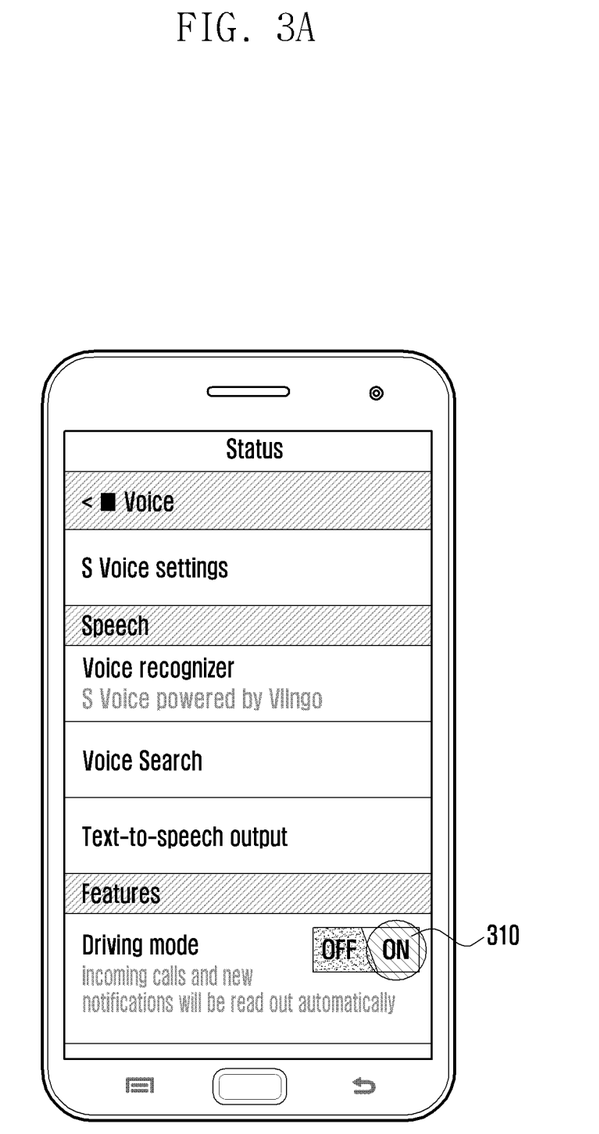
FIGS. 3A and 3B are examples of a screen of setting a driving mode according to an embodiment of the present disclosure.
Figure 3B:
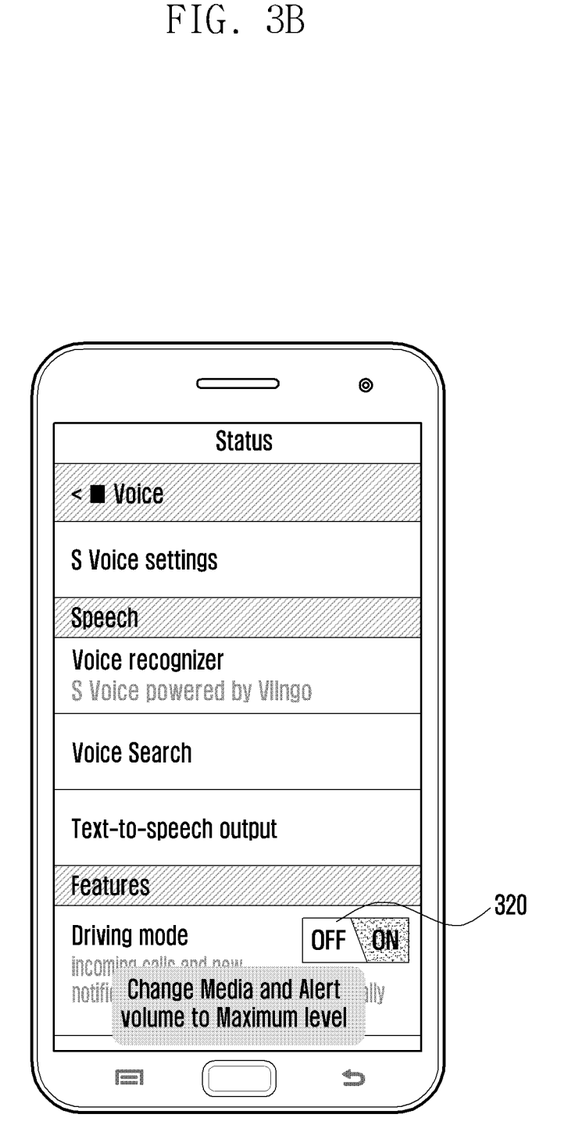

FIG. 2 is a flowchart illustrating a method of setting a driving mode according to an embodiment of the present disclosure. FIGS. 3A and 3B are examples of a screen of setting a driving mode according to an embodiment of the present disclosure.

Referring to FIG. 2, in operation 210, the controller 190 determines whether the request for the voice-speech service is detected. Here, the request may be pressing of the home key twice, pressing of the earphone key twice, or any other similar and/or suitable user input. If the request of the voice-speech service is detected, then the controller 190 executes the voice-speech service application 131. That is, the controller 190 loads the voice-speech service application 131 to the main memory, decodes the commands of the program by accessing the voice-speech service application 131 loaded to the main memory, and executes the function according to the result of the decoding. For example, the display unit 110 displays the service image including the icon of a microphone shape under control of the controller 190. The audio processing unit 150 outputs the greeting message to the speaker SPK, the ear jack 160, or the Bluetooth module under control of the controller 190.

Further, if the request for the voice-speech service is detected, then the controller 190 activates the sensor unit 170. As such, the sensor unit 170 generates sensing information and transmits the sensing information to the controller 190. The sensor unit 170 may be activated in advance.

In operation 220, the controller 190 determines whether the user is driving, or in other words, determines whether the user is operating a vehicle. For example, referring to FIGS. 3A and 3B, the display unit 110 displays the environment setting menu of the voice-speech service under control of the controller 190. If the user touches an ON button 310, which is in a deactivated state, e.g., a light color, as shown in FIG. 3A, in the environment setting menu, the controller 190 detects such a touch from the touch panel 111. Likewise, if the touch to the ON button 310, which is in the deactivated state, is detected, then the controller 190 determines that the user is driving or operating a vehicle.

If it is determined that the user is driving, then the controller 190 sets the operating mode of the voice-speech service as the driving mode in operation 230. For example, the controller 190 controls the display unit 110 to display the ON button 310 in the activated state, e.g., the dark color as shown in FIG. 3B, in response to the touch to the ON button 310. Further, the controller 190 sets the operating mode of the voice-speech service as the driving mode in response to the touch on the ON button 310.

If it is determined that the user is not driving or operating a vehicle, then the controller 190 sets the operating mode of the voice-speech service as the non-driving mode in operation 240. For example, if an OFF button 320 is in an activated state, then the controller may determine that the user is not driving and may set the operating mode of the voice-speech service as the non-driving mode.

Further, the operating mode of the voice-speech service may be automatically set. For example, the display unit 110 may display an "automatic change" button (not shown) under the control of the controller 190. If the user touches the "automatic change" button, which is in a deactivated state, e.g., a state where the checkbox is not checked, then the controller 190 detects such a touch from the touch panel 111, and controls the display unit 110 to display the "automatic change" button in the activated state, e.g., the state where the checkbox is checked.

Likewise, if the automatic change button is in an activated state, in operation 220, then the controller 190 may determine whether the user is driving using the GPS information received from the GPS reception unit 180, the map information received from the wireless communication unit 140 or stored in the storage unit 130, or according to any other suitable and/or similar information. For example, if the calculated speed is 40 km/h or more and the moving direction is constant during a predetermined time, then the controller 190 determines that the user is driving or operating the vehicle and moves to operation 230 in order to set the operating mode of the voice-speech service as the driving mode. In contrast, if the calculated speed is 40 km/h or less, then the controller 190 may determine that the user is not driving or operating the vehicle and may move to operation 240 in order to set the operating mode of the voice-speech service as the non-driving mode.

Figure 4:
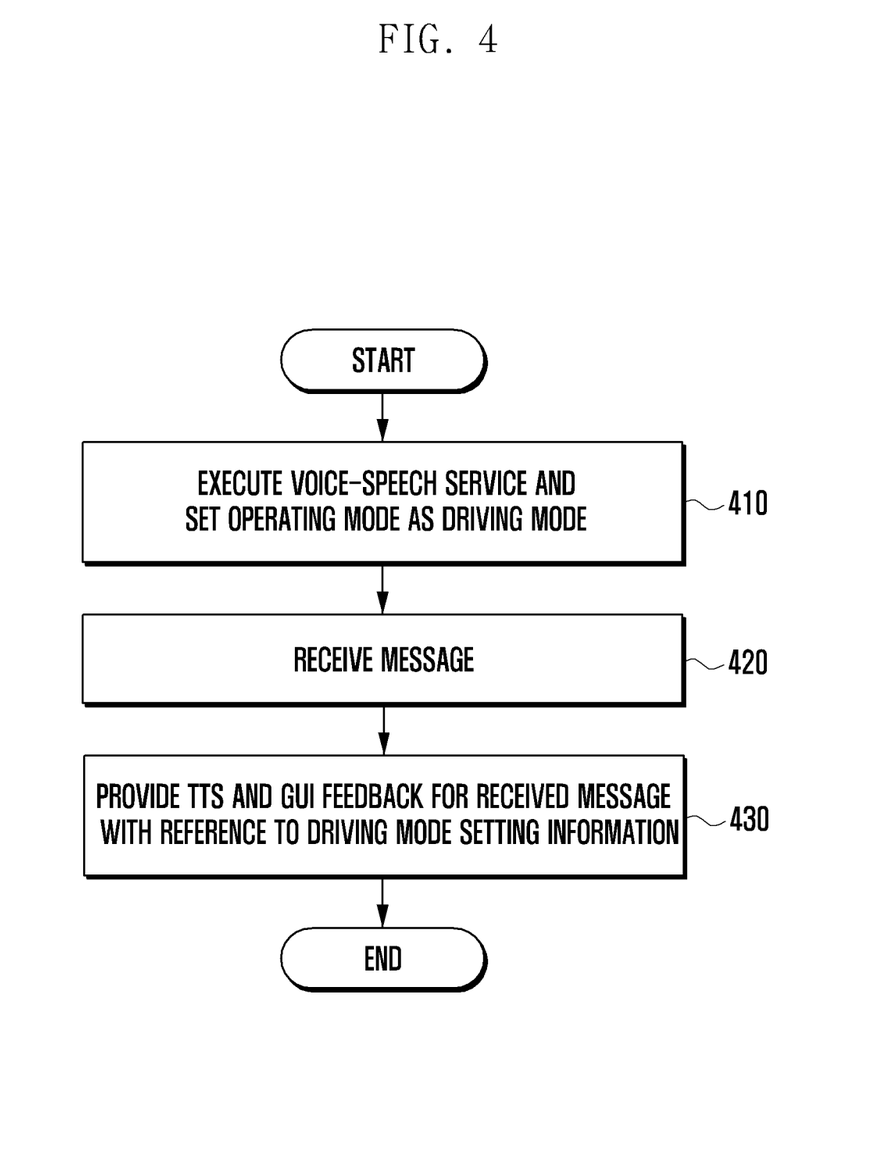
FIG. 4 is a flowchart illustrating a method of providing a voice-speech service according to an embodiment of the present disclosure.
Figure 5A:
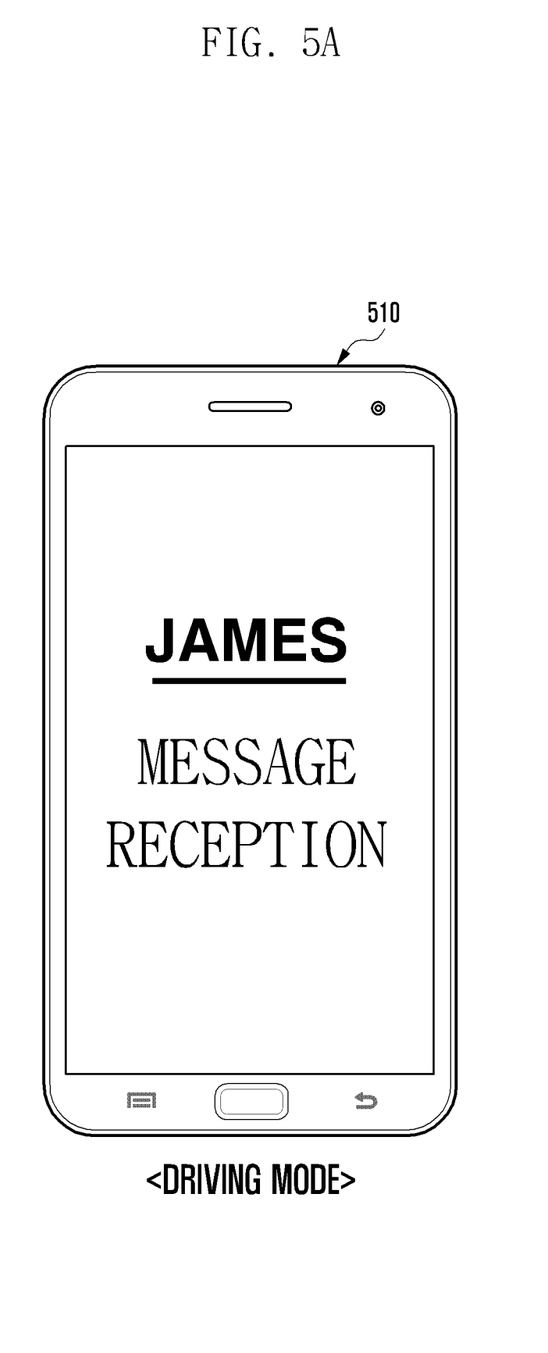
FIG. 5A is an example of a message which is displayed when a voice-speech service is set as a non-driving mode according to an embodiment of the present disclosure.
Figure 5B:
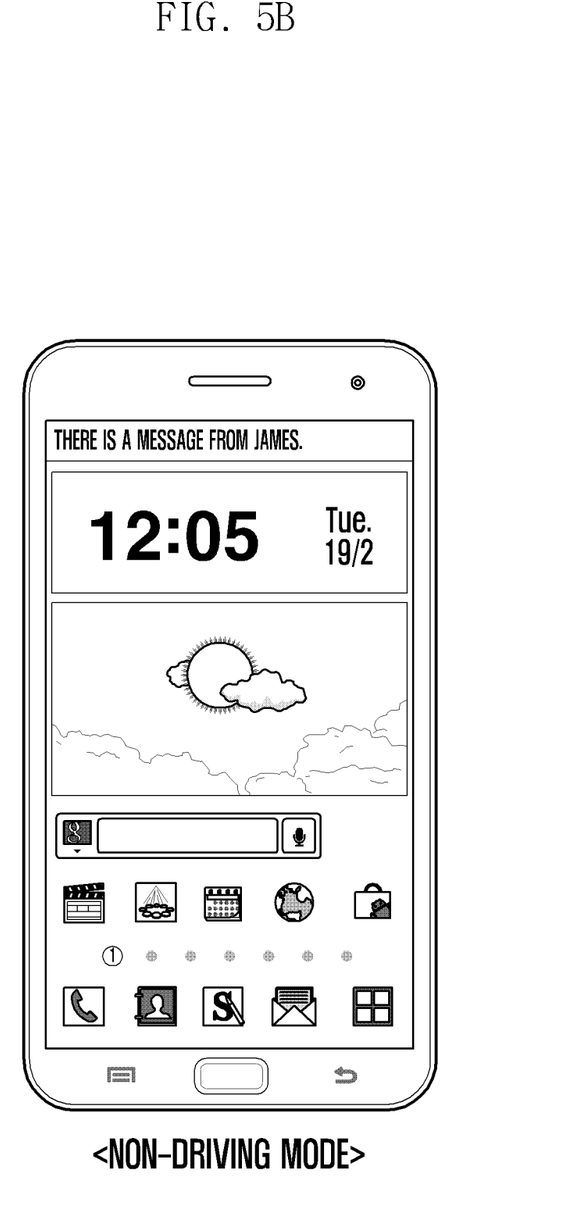
FIG. 5B is an example of a message which is displayed when the voice-speech service is set as a driving mode according to an embodiment of the present disclosure.

FIG. 4 is a flowchart illustrating a method of providing a voice-speech service according to an embodiment of the present disclosure. FIG. 5A is an example of a message which is displayed when a voice-speech service is set as a non-driving mode according to an embodiment of the present disclosure, and FIG. 5B is an example of a message which is displayed when the voice-speech service is set as a driving mode according to an embodiment of the present disclosure.

Referring to FIG. 4, the controller 190 executes the voice-speech service and sets the operating mode as the driving mode in operation 410.

In a state where the voice-speech service is being operated and the operating mode has been set as the driving mode, the controller 190 may receive a message from the wireless communication unit 140 in operation 420. Some examples of such a message are a call connection request message, a text message, a Social Network Service (SNS) message, an application update notification message, or any other similar and/or suitable type of message.

If such a message is received, then in operation 430, the controller 190 provides the received message as the TTS feedback and the GUI feedback with reference to the driving mode setting information 132. In detail, the controller 190 controls the audio processing unit 150 so as to convert the received message into a voice message and outputs the voice message to the speaker SPK. At this time, the controller 190 may control the audio processing unit 150 so as to increase the volume of the speaker SPK. However, when the audio signal is outputted to the ear jack 160, then the controller 190 may not increase the volume. When the external device connected to the Bluetooth module is identified as the wireless earphone and the audio signal is outputted to the wireless earphone, then the controller 190 may not increase the volume. Further, when the amount of the TTS feedback exceeds the threshold, for example, the TTS feedback is more than 100 characters or any other similar and/or suitable number of characters, then the controller 190 may control the audio processing unit 150 to set the replay speed of the TTS feedback to the double rate. If the replay of the TTS feedback is lengthened, then the user may not be able to concentrate on driving or operating a vehicle. Further, the user may feel bored by the feedback. Further, the user may not remember the heard information. Hence, when the user is driving or operating a vehicle, providing the feedback at an appropriate speed for not too long of a time may be helpful to the safe driving.

Further, if a message is received in a state where the voice-speech service is being executed and the operating mode has been set to the driving mode, then the controller 190 summarizes the reception message as summary information. For example, the controller 190 extracts words related with a time, a place, a name, or any other similar and/or suitable information, from the received message. The controller 190 combines the extracted words, e.g., "James", with a predetermined notification, e.g., "message", "receive", to generate summary information. The controller 190 controls the display unit 110 to display the summary information 510 as illustrated in FIG. 5A. Further, the controller 190 may control the display unit 110 to display the summary information 510 in the center of the screen, in any suitable part of the screen, or in the entirety of the screen. The controller 190 may control the display unit 110 to maximize a character size of the summary information 510. Further, the controller 190 may control the display unit 110 so as to make the characters thick. FIG. 5B is information related with the received message, which is displayed in the non-driving mode. Readability in FIG. 5A is higher than that in FIG. 5B. Hence, the user may intuitively, easily, and/or quickly determine the meaning of the received message for a short time based on the summary information 510. Such a GUI feedback may be omitted.

Figure 6:
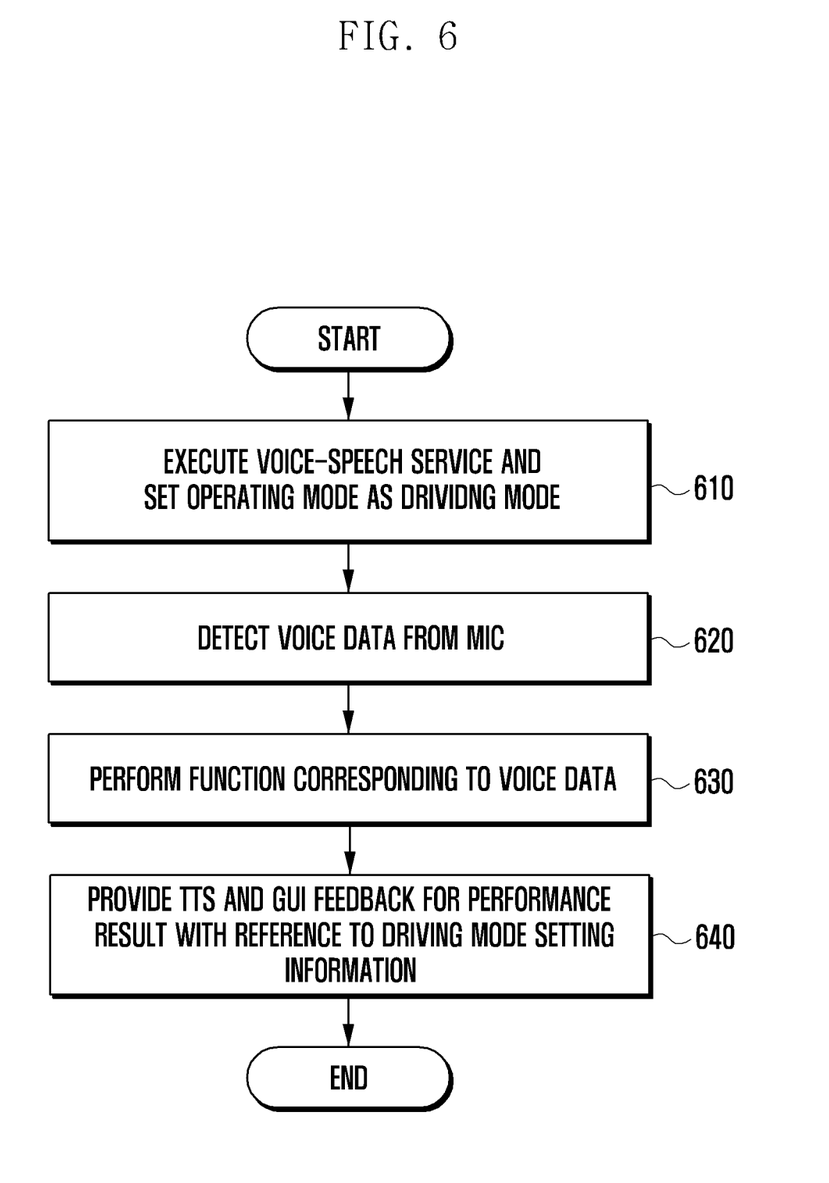
FIG. 6 is a flowchart illustrating a method of providing a voice-speech service according to another embodiment of the present disclosure.
Figure 7A:
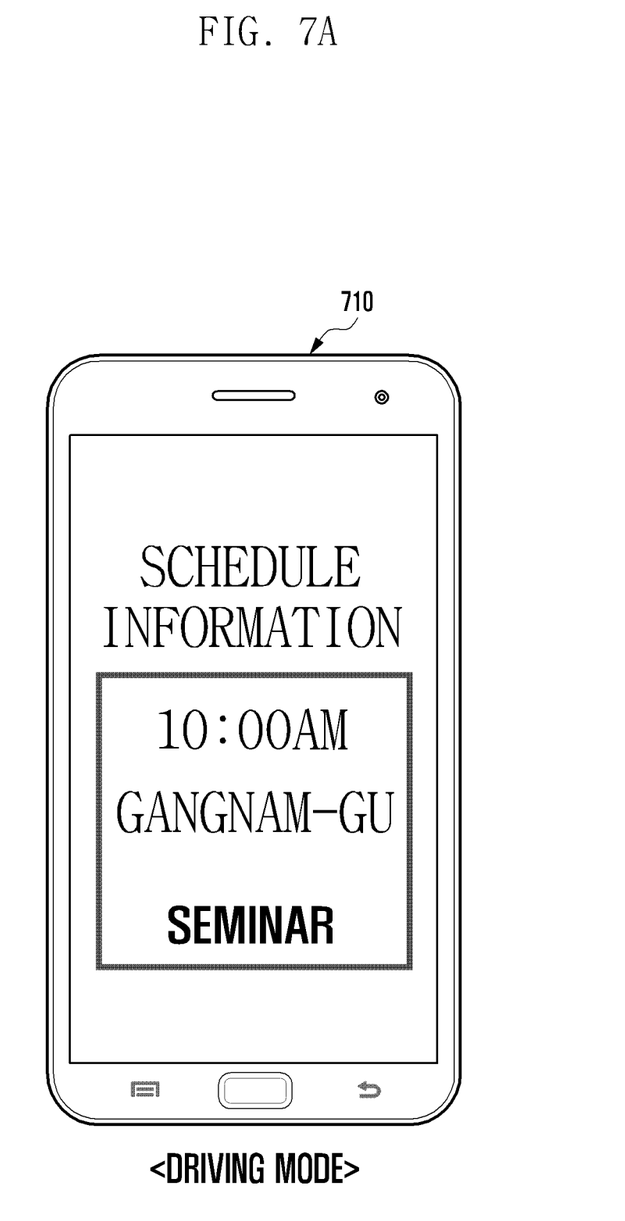
FIG. 7A is an example of a Graphic User Interface (GUI) feedback which is displayed when a voice-speech service is set as a non-driving mode according to an embodiment of the present disclosure.
Figure 7B:
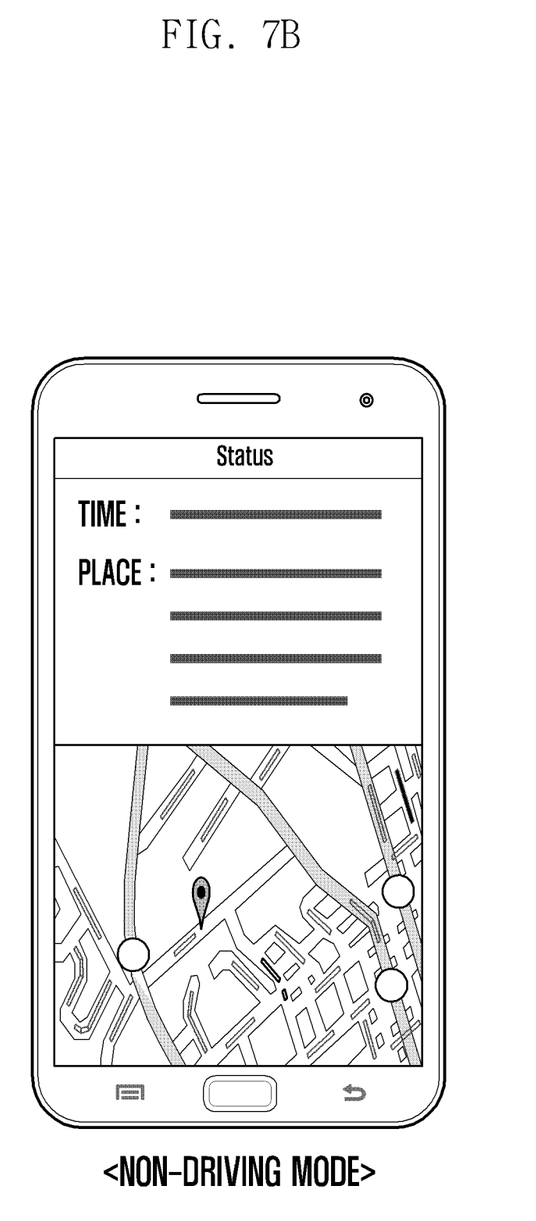
FIG. 7B is an example of a GUI feedback which is displayed when a voice-speech service is set as a driving mode according to an embodiment of the present disclosure.

FIG. 6 is a flowchart illustrating a method of providing a voice-speech service according to another embodiment of the present disclosure. FIG. 7A is an example of a GUI feedback which is displayed when a voice-speech service is set as a non-driving mode according to an embodiment of the present disclosure, and FIG. 7B is an example of a GUI feedback which is displayed when a voice-speech service is set as a driving mode according to an embodiment of the present disclosure.

Referring to FIG. 6, in operation 610, the controller 190 executes the voice-speech service, and sets the operating mode as the driving mode.

In a state where the voice-speech service is being executed and the operating mode has been set as the driving mode, the controller 190 may detect voice data, e.g., "let me know the tomorrow's schedule" from the microphone MIC or from the microphone of the earphone, through the audio processing unit 160 in operation 620.

If the voice data is detected, then the controller 190 may perform a function corresponding to the voice data in operation 630. In detail, the controller 190 first converts voice data into a text. The controller 190 may infer or determine a meaning of the text. Further, the controller 190 may transmit the text to the server to infer or determine a meaning of the text. If the inferring or determining is successful, then the controller 190 performs the function corresponding to the meaning of the text. For example, the controller 190 may search for the schedule of February 25 from the calendar information which is stored in the storage unit 130 or stored in the database server or stored in any other similar and/or suitable location that may be searched by the controller 190.

In operation 640, the controller 190 provides a performance result, e.g., the schedule of February 25, as the TTS feedback and the GUI feedback with reference to the driving mode setting information 132. In detail, the controller 190 controls the audio processing unit 150 so as to convert the performance result into a voice message and to output the voice message to the speaker SPK. At this time, the controller 190 may control the audio processing unit 150 to increase the volume of the speaker SPK. Further, when the amount of the TTS feedback exceeds the threshold, the controller 190 may control the audio processing unit 150 to set the replay speed of the TTS feedback to the double rate.

Further, if the voice-speech service is being executed and the operating mode is set to the driving mode, then the controller 190 summarizes the performance result as summary information. For example, the controller 190 extracts related words corresponding to a time, a place, a name, or any other similar and/or suitable types of information, from the performance result. The controller 190 combines the extracted words, e.g., LOAM, Gangam-gu, Seminar, with predetermined notification words, e.g., schedule information, so as to generate summary information 710. As illustrated in FIG. 7A, the controller 190 controls the display unit 110 to display the summary information 710. Further, the controller 190 may control the display unit 110 to display the summary information 710 at the maximum character size. FIG. 7B is information related with schedule information which is displayed in the non-driving mode. Readability in FIG. 7A, although not displayed in detail, is higher compared with FIG. 7B. Hence, the meaning of the received message may be intuitively, quickly, and/or more easily recognized within a short time, based on the summary information 710. Further, the GUI feedback may be omitted.

The foregoing method of the present disclosure may be implemented in an executable program command form by various computer means and be recorded in a non-volatile computer readable recording medium. In this case, the non-volatile computer readable recording medium may include a program command, a data file, and a data structure individually or a combination thereof. In the meantime, the program command recorded in the non-volatile computer readable recording medium may be specially designed or configured for the present disclosure or be known to a person having ordinary skill in a computer software field to be used. The non-volatile computer readable recording medium includes magnetic media such as a hard disk, a floppy disk, a magnetic tape, or any other similar and/or suitable magnetic media, optical media such as a Compact Disc Read Only Memory (CD-ROM), a Digital Versatile Disc (DVD), or any other similar and/or suitable optical media, a magneto-optical media such as a floptical disk or any other similar and/or suitable magneto-optical media, and a hardware device such as a ROM, RAM, flash memory, or any other similar and/or suitable hardware device. Further, the program command includes a machine language code created by a complier and a high-level language code executable by a computer using an interpreter. The foregoing hardware device may be configured to be operated as at least one software module to perform an operation of the present disclosure.

As described above, a method of providing a voice-speech service and a mobile terminal which implements the method may provide a voice-speech service which is optimized for a driving situation.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method of providing a voice-speech service in a mobile terminal, the method comprising:
   receiving sensing information from a sensor unit;
   determining whether to set an operating mode of the voice-speech service as a driving mode according to the sensing information; and
   providing an audible feedback according to pre-stored driving mode setting information when an operating mode of the voice-speech service is set as the driving mode,
   wherein the providing of the audible feedback comprises increasing a replay speed of the audible feedback to be higher than the replay speed of the audible feedback when the voice-speech service is set as a non-driving mode if an amount of the audible feedback is greater than a predetermined threshold.

2. The method of claim 1, wherein the providing of the audible feedback comprises increasing a volume of the audible feedback when the voice-speech service is set as the driving mode to be higher than the volume of the audible feedback when the voice-speech service is set as a non-driving mode.

3. The method of claim 1, further comprising providing a visible feedback with reference to the driving mode setting information if the operation mode of the voice-speech service is set as the driving mode.

4. The method of claim 3, wherein the providing of the visible feedback comprises:
   summarizing information to be provided as feedback; and
   providing the summarized information as a visible feedback.

5. The method of claim 3, wherein the providing of the visible feedback comprises providing the visible feedback when the voice-speech service is operated in the driving mode in a font size larger than the font size when the voice-speech service is operated in a non-driving mode.

6. A method of providing a voice-speech service in a mobile terminal, the method comprising:
   receiving a message;
   converting the message into an audible feedback; and
   providing the audible feedback according to pre-stored driving mode setting information when an operation mode of the voice-speech service is a driving mode,
   wherein the providing of the audible feedback comprises increasing a replay speed of the audible feedback to be higher than the replay speed of the audible feedback when the voice-speech service is set as a non-driving mode if an amount of the audible feedback is greater than a predetermined threshold.

7. The method of claim 6, wherein the driving mode setting information includes at least one of a volume setting value of a speaker, a color setting value of a screen, a brightness setting value of the screen, and a replay speed setting value of the audible feedback.

8. A method of providing a voice-speech service in a mobile terminal, the method comprising:
   detecting voice data from a microphone;
   performing a function corresponding to the voice data;
   converting a result of the performing of the function into an audible feedback; and
   providing the audible feedback according to pre-stored driving mode setting information if an operation mode of the voice-speech service is a driving mode,
   wherein the providing of the audible feedback comprises increasing a replay speed of the audible feedback to be higher than the replay speed of the audible feedback when the voice-speech service is set as a non-driving mode if an amount of the audible feedback is greater than a predetermined threshold.

9. The method of claim 8, wherein the driving mode setting information includes at least one of a volume setting value of a speaker, a color setting value of a screen, a brightness setting value of the screen, and a replay speed setting value of the audible feedback.

10. A mobile terminal for providing a voice-speech service, the mobile terminal comprising:
    a microphone;
    a speaker;
    an audio processing unit configured to process a signal received from at least one of the microphone and the speaker;
    a storage unit configured to store driving mode setting information;
    a sensor unit configured to sense a physical amount; and
    a controller configured to control at least one of the microphone, the speaker, the storage unit, the audio processing unit, and the sensor unit,
    wherein the controller is configured to receive sensing information, to determine whether to set an operating mode of the voice-speech service as a driving mode according to the sensing information, and to provide an audible feedback according to the driving mode setting information if the operation mode of the voice-speech service is set as the driving mode, and
    wherein the providing of the audible feedback comprises increasing a replay speed of the audible feedback to be higher than the replay speed of the audible feedback when the voice-speech service is set as a non-driving mode if an amount of the audible feedback is greater than a predetermined threshold.

11. The mobile terminal of claim 10, wherein the controller is configured to increase a volume of the audible feedback when the voice-speech service is set as the driving mode to be greater than a volume of the audible feedback when the voice-speech service is set as a non-driving mode.

12. The mobile terminal of claim 10, wherein the controller is configured to increase a replay speed of the audible feedback when the voice-speech service is set as the driving mode to be greater than the replay speed when the voice-speech service is set as a non-driving mode.

13. The mobile terminal of claim 10, wherein the controller is configured to provide a visible feedback according to the driving mode setting information when the operating mode of the voice-speech service is set as the driving mode.

14. The mobile terminal of claim 13, wherein the controller is configured to summarize information to be provided as feedback and to provide the summarized information as a visible feedback.

15. The mobile terminal of claim 13, wherein the controller is configured to provide the visible feedback when the voice-speech service is set as the driving mode with a font size greater than the font size when the voice-speech service is set as a non-driving mode.

* * * * *